(12) United States Patent
Tamagaki

(10) Patent No.: US 8,303,714 B2
(45) Date of Patent: Nov. 6, 2012

(54) CONTINUOUS FILM FORMING APPARATUS

(75) Inventor: Hiroshi Tamagaki, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 662 days.

(21) Appl. No.: 12/525,832

(22) PCT Filed: Jan. 15, 2008

(86) PCT No.: PCT/JP2008/050348
§ 371 (c)(1),
(2), (4) Date: Aug. 5, 2009

(87) PCT Pub. No.: WO2008/099630
PCT Pub. Date: Aug. 21, 2008

(65) Prior Publication Data
US 2010/0313810 A1  Dec. 16, 2010

(30) Foreign Application Priority Data
Feb. 13, 2007   (JP) .................................. 2007-031585

(51) Int. Cl.
*C23C 16/00* (2006.01)
*C23C 14/00* (2006.01)
(52) U.S. Cl. .................................. 118/718; 204/298.24
(58) Field of Classification Search .................. 118/718; 204/298.24
See application file for complete search history.

(56) References Cited

U.S. PATENT DOCUMENTS

| | | | |
|---|---|---|---|
| 4,013,532 A | 3/1977 | Cormia et al. | |
| 4,863,756 A * | 9/1989 | Hartig et al. | 427/488 |
| 6,911,779 B2 * | 6/2005 | Madocks | 315/111.21 |
| 7,023,128 B2 * | 4/2006 | Madocks | 313/359.1 |
| 7,294,283 B2 * | 11/2007 | Madocks | 216/67 |
| 2004/0135485 A1 | 7/2004 | Madocks | |
| 2006/0008593 A1 | 1/2006 | Fayet et al. | |
| 2012/0174864 A1 * | 7/2012 | Tamagaki et al. | 118/718 |
| 2012/0180720 A1 * | 7/2012 | Segawa et al. | 118/708 |

FOREIGN PATENT DOCUMENTS

CN 1688745 A 10/2005

(Continued)

OTHER PUBLICATIONS

Office Action issued Nov. 12, 2010, in China Patent Application No. 200880004886.X (with English translation).

(Continued)

*Primary Examiner* — Karla Moore
(74) *Attorney, Agent, or Firm* — Oblon, Spivak, McClelland, Maier & Neustadt, L.L.P.

(57) ABSTRACT

The plasma CVD apparatus of the present invention comprises a pair of deposition rolls 2 and 3 disposed oppositely in parallel so that a substrate S wound thereon faces each other; a magnetic field generating member 12 and 13 provided inside each of the deposition rolls 2 and 3, which generates a magnetic field so as to converge plasma to the vicinity of a roll surface thereof facing a space 5 between the deposition rolls; a plasma power source 14 with polarity alternately reversing between one electrode and the other electrode; a gas supply pipe 8 for supplying a film-forming gas to the space 5; and evacuation means for evacuating the space. One electrode of the plasma power source 14 is connected to one deposition roll 2, and the other electrode thereof to the other deposition roll 3.

10 Claims, 7 Drawing Sheets

FOREIGN PATENT DOCUMENTS

| | | |
|---|---|---|
| JP | 51 112489 | 10/1976 |
| JP | 2587507 | 3/1997 |
| JP | 2003 49273 | 2/2003 |
| JP | 2005 504880 | 2/2005 |
| JP | 2006 501367 | 1/2006 |
| WO | WO 02/086185 A1 | 10/2002 |

OTHER PUBLICATIONS

Korean Office Action issued Aug. 12, 2011, in Patent Application No. 10-2009-7016778 (with English-language translation).
U.S. Appl. No. 13/393,382, filed Feb. 29, 2012, Segawa, et al.
U.S. Appl. No. 13/395,800, filed Mar. 13, 2012, Tamagaki, et al.

* cited by examiner

CONTINUOUS FILM FORMING APPARATUS

FIELD OF THE INVENTION

The present invention relates to a plasma CVD apparatus for continuously forming a functional film on a surface of a strip-like substrate such as a plastic film or sheet.

BACKGROUND OF THE INVENTION

In recent years, various display substrates using plastic film or sheet as a substrate have been proposed, and the substrate is required to have barrier properties to water vapor and oxygen. For giving such barrier properties to the substrate, the substrate is often subjected to coating with a transparent SiOx film, and a productive coating means therefor is desired. As techniques for coating the substrate with the SiOx film in the process of carrying the substrate from a roll to a roll, for example, physical vapor deposition (PVD) method such as vacuum evaporation or sputtering, and plasma CVD (plasma enhanced-chemical vapor deposition) method are known.

The vacuum evaporation method is extensively used to perform film formation mainly to food packaging films as a productive process, but the resulting barrier performance does not satisfy a level requested as display substrate, with water vapor transmission and oxygen transmission of about 1 g/m2·day and about 1 cc/m2·atm·day. On the other hand, a denser film can be formed by the sputtering method. For example, barrier performances of not more than 0.02 g/m2·day and 0.02 cc/m2·atm·day that are detection limits of MOCON method can be attained by forming a SiOx or SiON film of 50-100 nm on a substrate in good surface condition. However, the deposition rate is too low to ensure sufficient productivity. Further, since a film formed by the PVD method is inorganic and brittle, the film, when formed in a thickness exceeding 100 nm, is easily subject to film defects or peeling, resulting from an internal stress of the film or a difference in thermal expansion coefficient between the film and the substrate, and further resulting from the failure of film to follow deformation of the base film.

In contrast, the plasma CVD method is inferior to the vacuum deposition method, but has superiority of one order of magnitude or more in terms of deposition rate to the sputtering method, and thus has a possibility that a high-barrier film can be formed. This method further has a feature that a film as thick as several hundreds nm to several μm which cannot be attained by the PVD method can be formed on the base film, since a film formed thereby has a certain level of flexibility. Therefore, the plasma CVD method is expected as a new film forming process utilizing these features.

Various types of film forming apparatuses by plasma CVD are conventionally known. As an apparatus adapted to perform film formation while winding a film around a deposition roll, for example, an apparatus including a pair of deposition rolls for winding and carrying a film that is a deposition object is described in Japanese translation of PCT International Application No. 2005-504880 (Patent Literature 1), in which a magnetic field is formed to extend between the rolls, and the pair of deposition rolls is connected to a high frequency power source so that the two deposition rolls have the same polarity, and a high frequency power of several tens to several hundreds kHz is simultaneously supplied thereto to cause penning discharge in a space (discharge area) between the rolls to confine plasma, and oxygen and a raw material gas such as HMDSO are supplied to the space between the rolls to consequently perform film formation simultaneously to the film on the deposition rolls at both sides of the discharge area.

Further, a plasma CVD apparatus is described in Japanese Patent No. 2587507 (Patent Literature 2), and the apparatus comprises a pair of deposition rolls (metal drums) disposed oppositely to each other within a vacuum chamber, an AC power source having one electrode connected to one of the deposition rolls and the other electrode connected to the other deposition roll, a discharge chamber disposed in a space between the deposition rolls with the faces opposed to the deposition rolls being opened, and a monomer (raw material) gas supply means connected to the discharge chamber. According to Patent Literature 2, plasma can be generated within the discharge chamber to perform film formation to a film on the deposition rolls since the inside of the discharge chamber is reduced in vacuum degree by supply of a monomer gas, compared to the outside, and contamination of the discharge electrodes can be prevented, since the surfaces of the deposition rolls constituting discharge electrodes are covered with the film carried thereon.

However, in the film forming apparatus of Patent Literature 1, because the other electrode of the power source for discharge must be connected to an annular electrode (counter electrode) provided substantially in an equal distance from the center of the space between the deposition rolls, plasma is generated also at the periphery of the counter electrode, and it is difficult to perfectly suppress film deposition in this periphery. Further, change in discharge associated with the film deposition to the counter electrode and flaking which are likely to develop film defects, are caused during long-time operation.

On the other hand, in the film forming apparatus of Patent Literature 2, although the discharge chamber must be formed in the space between the deposition rolls, film deposition occurs on the wall of the discharge chamber, and flaking occurring from this portion is likely to develop film defects. In addition, for making the inside of the discharge chamber lower in vacuum degree (or higher pressure) than the other part within the vacuum chamber, the flow of the gas must be suppressed by extremely minimizing the gap between the discharge chamber and the deposition rolls. However, since the film deposition occurs also in the vicinity of this gap, the gas confining effect of the discharge chamber is changed, impairing the stability of deposition, and the stability of film quality is consequently reduced.

[Patent Literature 1] Japanese translation of PCT International Application No. 2005-504880
[Patent Literature 2] Japanese Patent No. 2587507

DISCLOSURE OF THE INVENTION

From the viewpoint of such problems, it is an object of the present invention to provide a plasma CVD apparatus, capable of reducing the film deposition on the inside of a vacuum chamber, which causes film flaking and adversely affects the stability of film quality.

The plasma CVD apparatus according to the present invention for forming a film on a surface of a substrate while continuously carrying the substrate within a vacuum chamber comprises: a pair of deposition rolls disposed oppositely in parallel or substantially in parallel to each other so that the substrate wound thereon faces each other; a magnetic field generating member provided inside each of the deposition rolls, which generates, in the vicinity of a roll surface thereof facing a space between the deposition rolls, a magnetic field swollen from the roll surface to a roll surface on the other side; a plasma power source with polarity alternately reversing between one electrode and the other electrode; gas supply means for supplying a film-forming gas to the space between the deposition rolls; and evacuation means for evacuating the space between the deposition rolls, wherein one electrode of the plasma power source is connected to one of the deposition rolls, and the other electrode is connected to the other of the deposition rolls.

According to this plasma CVD apparatus, since the magnetic field generating member which generates the magnetic field particularly in the vicinity of the roll surfaces facing the space between the deposition rolls, the magnetic field being swollen from each roll surface to the roll surface on the other side, and the plasma power source with alternately reversing polarity are provided, occurrence of electric discharge in the space between the pair of deposition rolls and convergence of plasma generated thereby to the vicinity of the respective deposition roll surfaces in the space between the deposition rolls can be attained without providing an enclosure for defining the space between the deposition rolls such as a discharge chamber or using a discharge electrode other than the deposition rolls. Therefore, only by supplying the film-forming gas from the gas supply means to the space between the deposition rolls, the film-forming gas is decomposed and activated by the plasma, and the decomposed gas is deposited on the surface of the substrate wound around the deposition rolls, facing the space between the deposition rolls, whereby a film can be efficiently formed. Since the enclosure or the discharge electrode other than the deposition rolls, to which the dissociated film-forming gas is adsorbed, is absent, film formation to the substrate can be performed without film deposition to such a part, and a high-quality film can be formed while suppressing the film defects and deterioration of film forming stability resulting from the film deposition.

BEST MODE FOR CARRYING OUT THE INVENTION

In the plasma CVD apparatus of the present invention, an alternating voltage or pulse-like voltage accompanying polarity reversion is applied to deposition rolls disposed oppositely to each other under a reduced pressure to cause glow discharge in a space (deposition zone) between the oppositely disposed deposition rolls, whereby film formation by plasma CVD is performed to a strip-like substrate wound around the deposition rolls to face the space between the deposition rolls. As the substrate, any insulating material which can be taken up in a roll shape such as plastic film or sheet or paper can be used. The suitable materials of plastic film or sheet are PET, PEN, PES, polycarbonate, polyolefin, polyimide and the like, and the substrate preferably has a thickness of 5 µm to 0.5 mm which allows carrying in vacuum. A conductive material can be used as the substrate depending on the configuration of the apparatus as described later.

Figure 1:
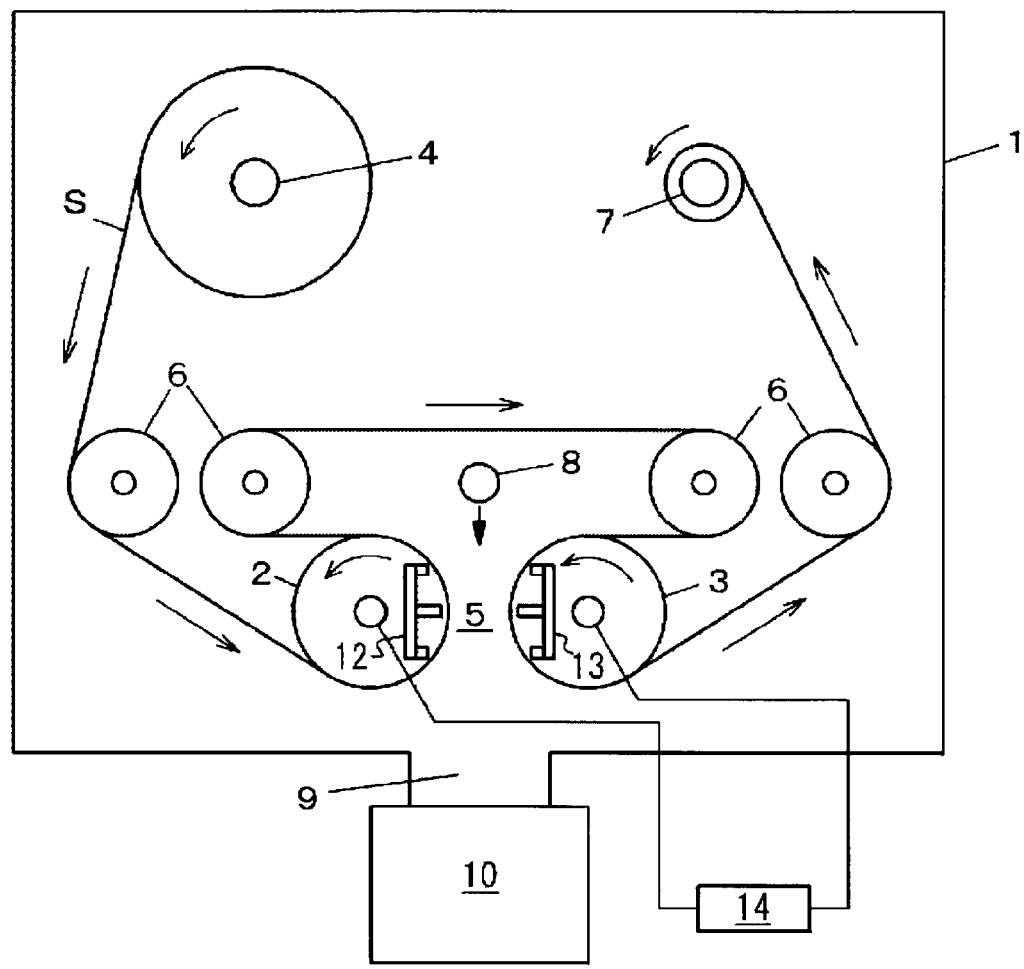
FIG. 1 is an overall layout illustrative view of a plasma CVD apparatus according to an embodiment of the present invention.
Figure 2:
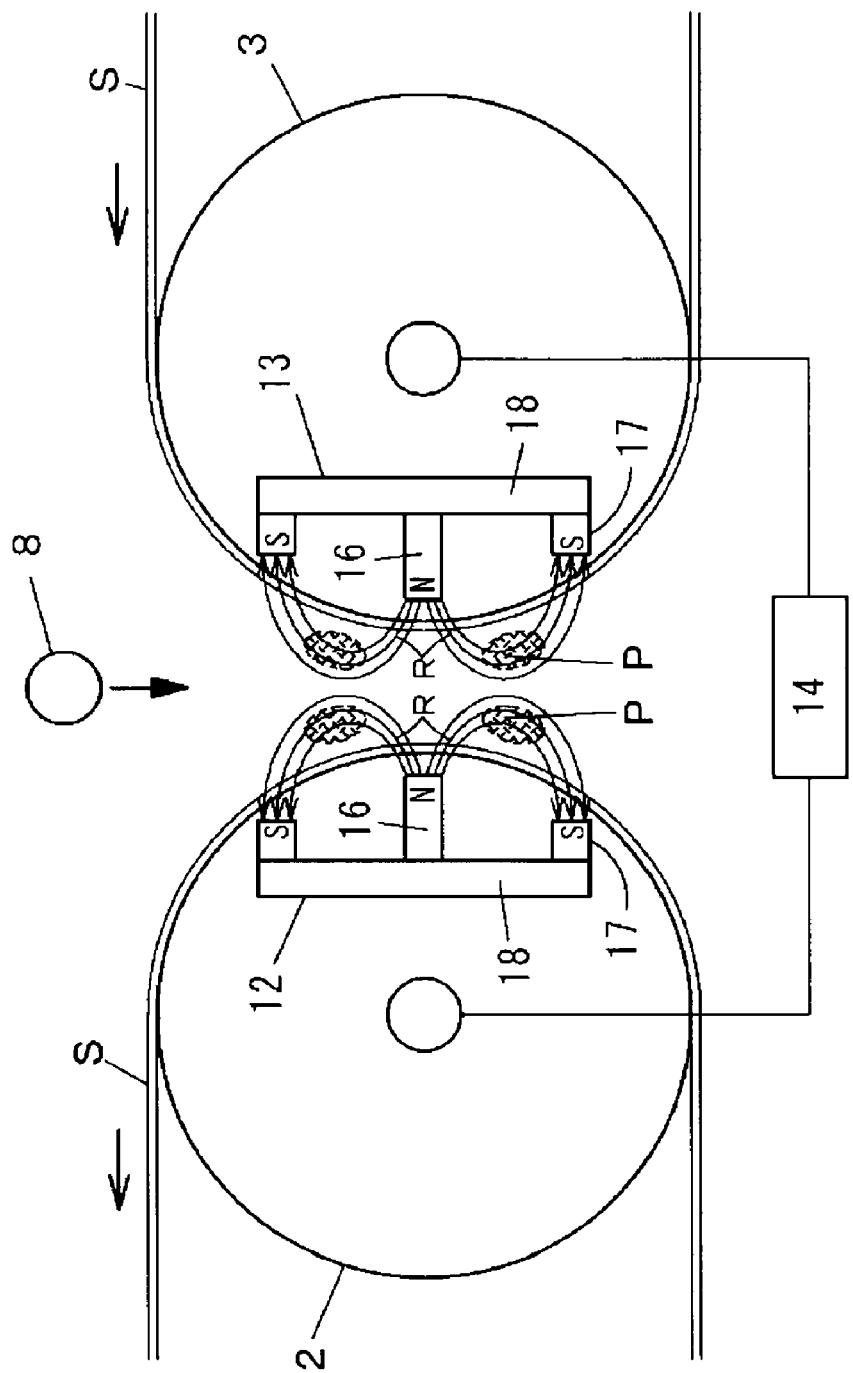
FIG. 2 is an enlarged sectional illustrative view of deposition rolls and magnetic field generating members.

FIG. 1 shows an overall configuration of a plasma CVD apparatus according to one embodiment of the present invention, and the apparatus comprises: a vacuum chamber 1; a pair of deposition rolls 2 and 3 disposed oppositely within the vacuum chamber 1 so that the respective roll axes are parallel to each other; a delivery roll 4 which holds and delivers a strip-like substrate S taken up in a roll shape; a plurality of carrying rolls 6 which carries the substrate S unwound from the delivery roll 4 so that the substrate S is wound around the deposition rolls 2 and 3 which face a space (deposition zone) 5 between one and the other deposition rolls 2 and 3; a take-up roll 7 which takes up the substrate S after film formation; a film-forming gas supply pipe 8 connected to a gas supply device (not shown) and disposed just above the space 5 to be parallel to the roll axes; an evacuation port 9 opened at the bottom wall of the vacuum chamber 1; and a vacuum pump 10 connected to the port. The film-forming gas supply pipe 8 includes a plurality of gas ejecting nozzles oriented to the space 5, which are provided in the longitudinal direction thereof, and the evacuation port 9 is disposed just below the space 5. Magnetic field generating members 12 and 13 are provided inside the deposition rolls 2 and 3 respectively, as shown in FIG. 2, and a plasma power source 14 is provided to supply a plasma power to the deposition rolls 2 and 3. The gas supply device and the film-forming gas supply pipe 8 constitute the gas supply means of the present invention, and the evacuation port 9 and the vacuum pump 10 constitute the evacuation means of the present invention.

As the film-forming gas to be supplied to the space 5 from the film-forming gas supply pipe 8, deposition raw material gas, reaction gas, carrier gas and discharge gas are used solely or in combination. Examples of the deposition raw material gas include HMDSO, TEOS, silane, dimethylsilane, trimethylsilane, tetramethylsilane, HMDS, and TMOS for forming a Si-containing film, methane, ethane, ethylene, and acetylene for forming a C-containing film, and titanium tetrachloride for forming a Ti-containing film, and an appropriate raw material gas is selected according to the kind of the film to be formed. As the reaction gas, oxygen, ozone or the like can be used for formation of an oxide, and nitrogen, ammonia or the like can be used for formation of a nitride. In this case, also, an appropriate gas is selected according to the kind of the film to be formed. As the carrier gas and the discharge gas, an appropriate gas can be selected from rare gas such as He, Ar, Ne or Xe and hydrogen.

The space 5 is evacuated by the vacuum pump 10 provided below the space, and is controlled to an appropriate pressure in accordance with the supply of the film-forming gas from the film-forming gas supply pipe 8. It is preferred not to provide a structural member such as a shielding wall or an electrode in the vicinity of the space 5 as much as possible as in the present invention, since film formation is performed around the space 5, whereby unnecessary film formation which causes film defects can be suppressed. The pressure of the space 5 will be described later.

Figure 3A:
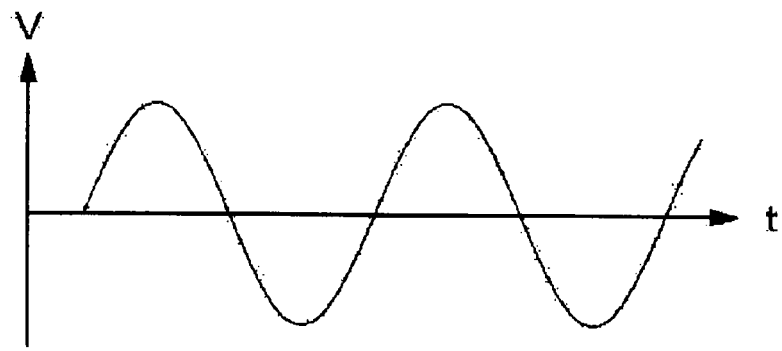
FIGS. 3A, 3B and 3C are voltage waveform charts of a plasma power source, respectively.
Figure 3B:
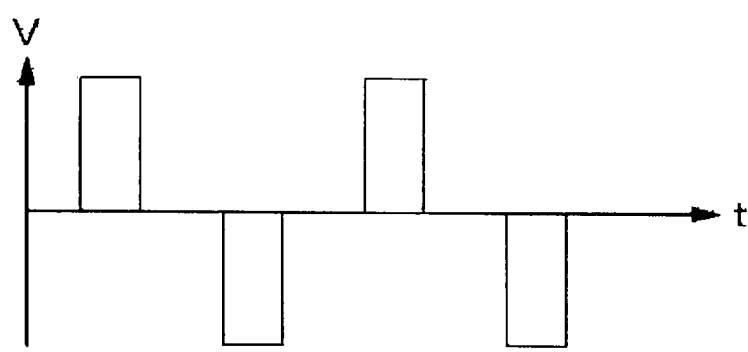
Figure 3C:
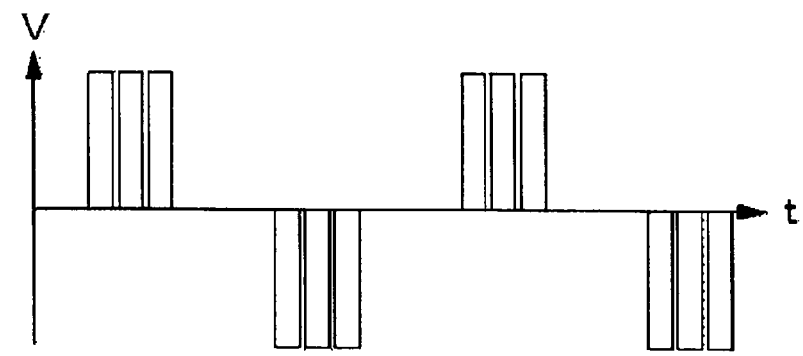

The deposition rolls 2 and 3 are electrically insulated from the vacuum chamber 1, and further electrically insulated from each other. One electrode of the plasma power source 14 is connected to one deposition roll 2, and the other electrode to the other deposition roll 3. The plasma power source 14 outputs a voltage with alternately reversing polarity, the voltage having a waveform, for example, such as alternating voltage of sine wave as shown in FIG. 3A or pulse-like form of square wave as shown in FIGS. 3B and 3C, and the waveform is slightly distorted by generation of discharge during actual operation. Other voltage waveforms can be adopted as long as they allow generation of discharge.

Figure 4:
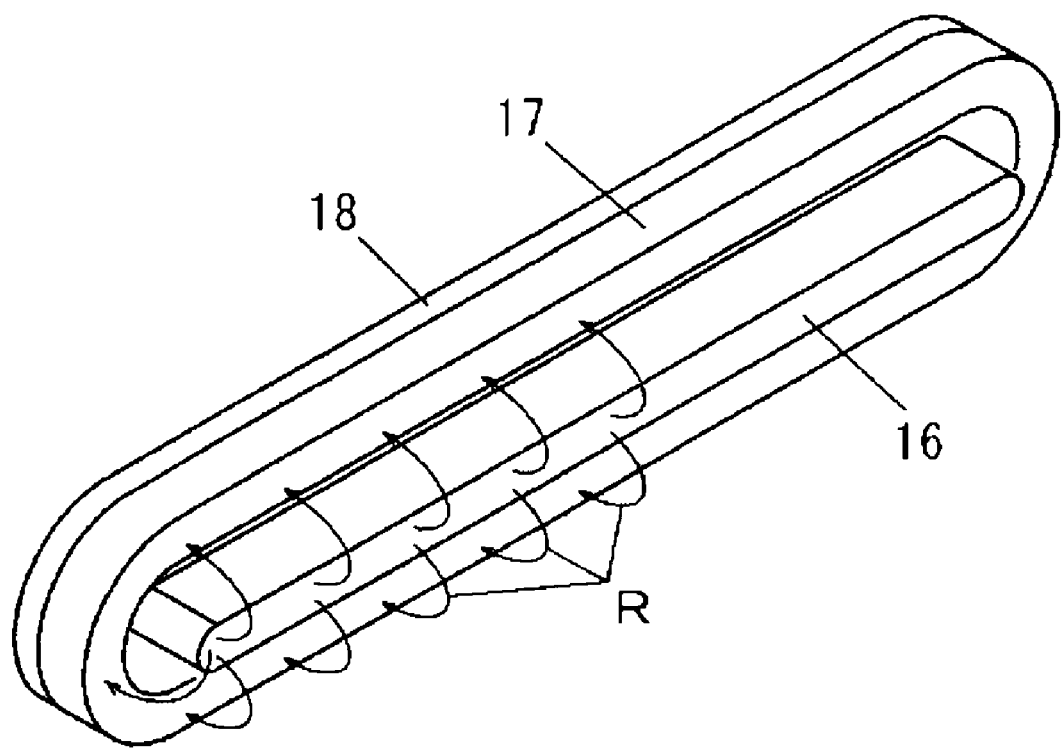
FIG. 4 is an overall perspective view of a magnetic field generating member.

The deposition rolls 2 and 3 include magnetic field generating members 12 and 13, which are provided so as to maintain a fixed positional relation relative to the space 5 even if the rolls are rotated. For example, the deposition rolls 2 and 3 may be hollowed, and the magnetic field generating members 12 and 13 may be held from the outside of the axial ends of the deposition rolls 2 and 3, thereby fixing the respective relative positions, and only the deposition rolls 2 and 3 may be rotated in this state. As shown in FIGS. 2 and 4, each of the magnetic field generating members 12 and 13 includes a central magnet 16 long in the roll axial direction, a race track-like circumferential magnet 17, and a magnetic field short-circuit member 18 connecting these magnets inside the roll. The "race track-like" shape means a shape obtained by arranging a pair of straight lines having the same length in parallel, and mutually connecting end parts on the same side of the pair of straight lines by an outwardly swollen semi-circular arc, or an athletics race track-like shape (refer to FIG. 4).

The magnetic field generating members 12 and 13 provided respectively on the deposition rolls 2 and 3 are disposed so that magnetic poles of the same polarity are opposed to each other. Each of the magnetic field generating member 12, 13 efficiently guides magnetic field lines leaving the magnetic pole of the central magnet 16 to the magnetic pole of the circumferential magnet 17 and generates a race track-like magnetic field R for magnetron discharge which has a double-peak section and is swollen from the roll surface to the space 5 in each of the deposition rolls 2 and 3. Namely, the "race track-like magnetic field R" means a magnetic field where magnetic field lines are directed from the central magnet 16 to the circumferential magnet 17 surrounding the circumference of the central magnet 16 in a race track shape, and are swollen toward the space 5, and the apex of the swollen magnetic field is formed in a race track shape along the circumferential magnet 17, viewed from a normal direction relative to a plane on which the central magnet 16 and the circumferential magnet 17 are disposed.

The magnetic field lines formed by the magnetic field generating member 12 provided for one deposition roll 2 form substantially closed magnetic circuits, respectively, without extending to the magnetic pole of the magnetic field generating member 13 provided for the opposed deposition roll 3. The "magnetic field line-extending" state means a state in which magnetic field lines directing from N-pole (S-pole) of one opposed magnetic field generating member 12 to S-pole (N-pole) of the other magnetic field generating member 13 are generated. For example, when the other magnetic field generating member 13 is changed so that the central magnetic pole 16 is S-pole and the circumferential magnet 17 is N-pole in FIG. 2, magnetic field lines directing from the central magnet (N-pole) 16 of the one magnetic field generating member 12 to the central magnet (S-pole) 16 of the other magnetic field generating member 13 are generated (refer to FIG. 7). This state is the "magnetic field line-extending" state.

As described above, the race track-like magnetic fields R having a double-peak section and extending in the roll axial direction are formed in the vicinity of the roll surfaces facing the space 5 between the deposition rolls 2 and 3, respectively, by the magnetic field generating members 12 and 13. The form of this magnetic field is similar to that of a magnetic field formed by, for example, a planar magnetron sputter cathode. The magnetic field R functions to cause plasma to generate preferentially at the location of the magnetic field and homogenize the plasma in the longitudinal direction of the rolls by drift of plasma or the like. Namely, the plasma generated by glow discharge is converged at swollen parts of the magnetic field lines by the race track-like magnetic field R, and a race track-like plasma P is consequently formed in the vicinity of each roll surface facing the space 5 between the deposition rolls 2 and 3. Namely, since the apex of the magnetic field swollen toward the space 5 is formed in the race track-shape, viewed from the normal direction relative to the plane on which the central magnet 16 and the circumferential magnet 17 are disposed as described above. Therefore, the plasma converging to this apex of the swollen magnetic field (the swollen parts of magnetic field lines) is formed so as to converge in a race track shape, viewed from the normal direction.

The distance between the two deposition rolls 2 and 3 may be appropriately adjusted by relations with the size of the magnetic field generating members 12 and 13 and the magnetic field intensity so that the plasma can be trapped.

When the high-frequency alternating or pulse-like voltage is applied from the plasma power source 14 to the deposition rolls 2 and 3 while supplying the film-forming gas to the space 5 between the deposition rolls 2 and 3 under the magnetic field R and adjusting and maintaining the space 5 constituting the deposition zone to and at an appropriate pressure, glow discharge occurs between the deposition rolls 2 and 3 through the space 5 and the substrate S wound around the surface of the deposition rolls 2 and 3 to thereby form the plasma P. Accordingly, if the film-forming gas is supplied to the space 5, the raw material gas is decomposed by the plasma in the space 5, and a film is formed on the substrate by the plasma CVD process.

Although plasma current cannot be carried by application of DC voltage, since the substrate S used in the present invention is an insulating material, propagation of current can be performed through the insulating substrate S with an appropriate frequency (about 1 kHz or more, preferably 10 kHz or more). The discharge voltage supplied from the plasma power source 14 is preferably about several hundreds to 2 thousands V as peak value. Since the deposition rolls 2 and 3 are connected to both electrodes of the plasma power source 14 which outputs the high-frequency alternating or pulse-like voltage, respectively, so that a positive voltage is applied to the other deposition roll 3 when a negative voltage is applied to one deposition roll 2, the current is carried from the other deposition roll 3 to the one deposition roll 2. And this phenomenon continues while reversing the polarity at high frequency.

Since the magnetic field R which facilitates the glow discharge is present only on the roll surface side facing the space 5, although the voltage from the plasma power source 14 is applied to the whole surface of the deposition rolls 2 and 3, the glow discharge can be caused around the area where the magnetic field is present if the pressure is within the range of about 0.1 Pa to 10 Pa. Therefore, there is no need to provide a discharge chamber such that it encloses the space 5. When the pressure is below about 0.1 Pa, discharge in the area where the magnetic field is present becomes difficult, and when the pressure exceeds about 10 Pa, discharge out of the magnetic field area becomes significant, causing undesirable film formation in a portion of the deposition rolls where no substrate is wound.

In the plasma CVD apparatus according to the above-mentioned embodiment, a film is formed on the substrate S supported on the roll surfaces facing the space 5 between the deposition rolls 2 and 3 while laying and carrying the substrate S over the two deposition rolls 2 and 3. The film formation to the substrate S is performed by decomposing the film-forming gas supplied to the space 5 by the race track-like plasma P formed by the race track-like magnetic field R formed in the vicinity of the roll surfaces by the magnetic field generating members 12 and 13 and the glow discharge caused in the space 5 between the deposition rolls 2 and 3 connected respectively to the respective electrodes of the plasma power source 14, and depositing the decomposed gas onto the substrate S supported on the surfaces of the deposition rolls 2 and 3 facing the space 5, whereby a film is formed on the surface of the continuously carried substrate S.

Since the glow discharge occurs only in the magnetic field existing areas in the vicinity of the surfaces of the deposition rolls 2 and 3 without needing an electrode involved in generation of plasma other than the deposition rolls 2 and 3 or a shielding member enclosing the space 5 such as a discharge chamber, the film formation by plasma CVD is substantially caused only on the substrate located on the surface of the deposition rolls 2 and 3. Since the substrate S that is a deposition object is wound around the deposition rolls 2 and 3 and regularly carried, stable discharge can be performed over a long period without generation of a thick film in a place involved in plasma generation in the present apparatus. Harmful flakes are hardly generated during the film formation. Further, since the mechanism related to plasma generation is composed of only the two deposition rolls 2 and 3, the plasma generation mechanism can be constituted by a minimum number of rolls.

Figure 5:
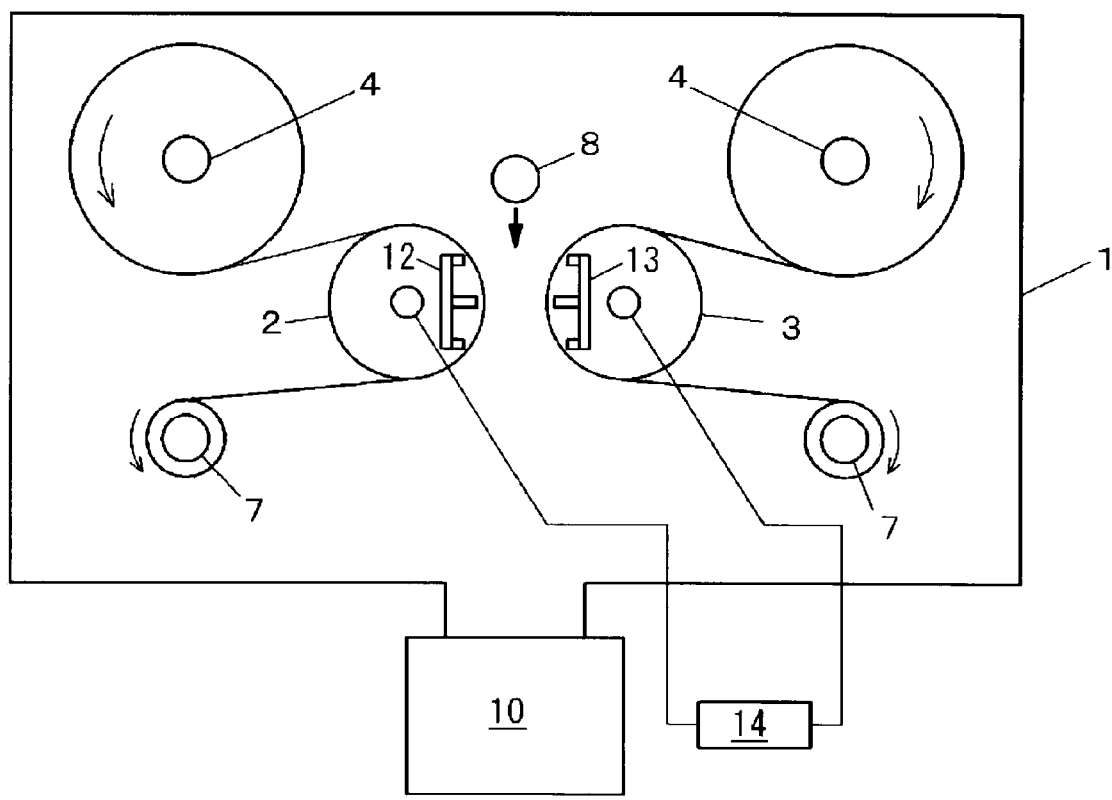
FIG. 5 is an overall layout illustrative view of a plasma CVD apparatus according to the other embodiment of the present invention.

Although one substrate S is wound around two deposition rolls 2 and 3 and carried in the above-mentioned embodiment, the carrying route of the substrate is never limited thereby. Delivery rolls 4 and take-up rolls 7 may be provided for the deposition rolls 2 and 3 respectively, as shown in FIG. 5, and the substrates S may be wound so as to be separately supported on the roll surfaces facing the space 5 between the deposition rolls 2 and 3. In cases such as a metal film composed of a metal with low electric resistance, the device configuration shown in FIG. 5 is preferred, since the current is carried through the film to destabilize the discharge when the electric resistance of the film is low. A conductive material such as metal can be used also as the substrate S in the device configuration shown in FIG. 5. The film formation can be performed even to the conductive substrate S in the device configuration shown in FIG. 5, although application of voltage to between the deposition rolls 2 and 3 is needed.

Figure 6:
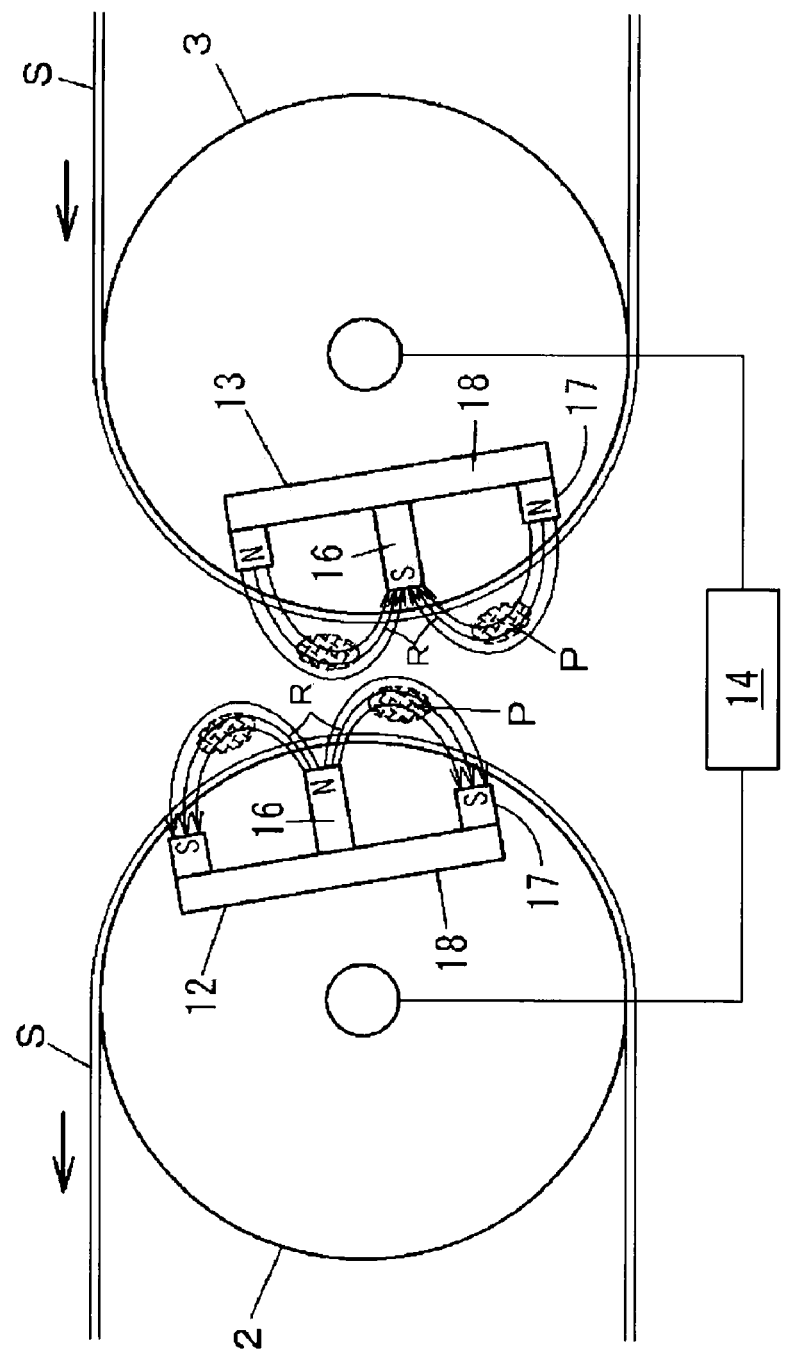
FIG. 6 is an enlarged sectional illustrative view of deposition rolls and magnetic field generating members, showing the other layout example in which the magnetic field generating members are disposed so as to form closed magnetic circuits respectively.
Figure 7:
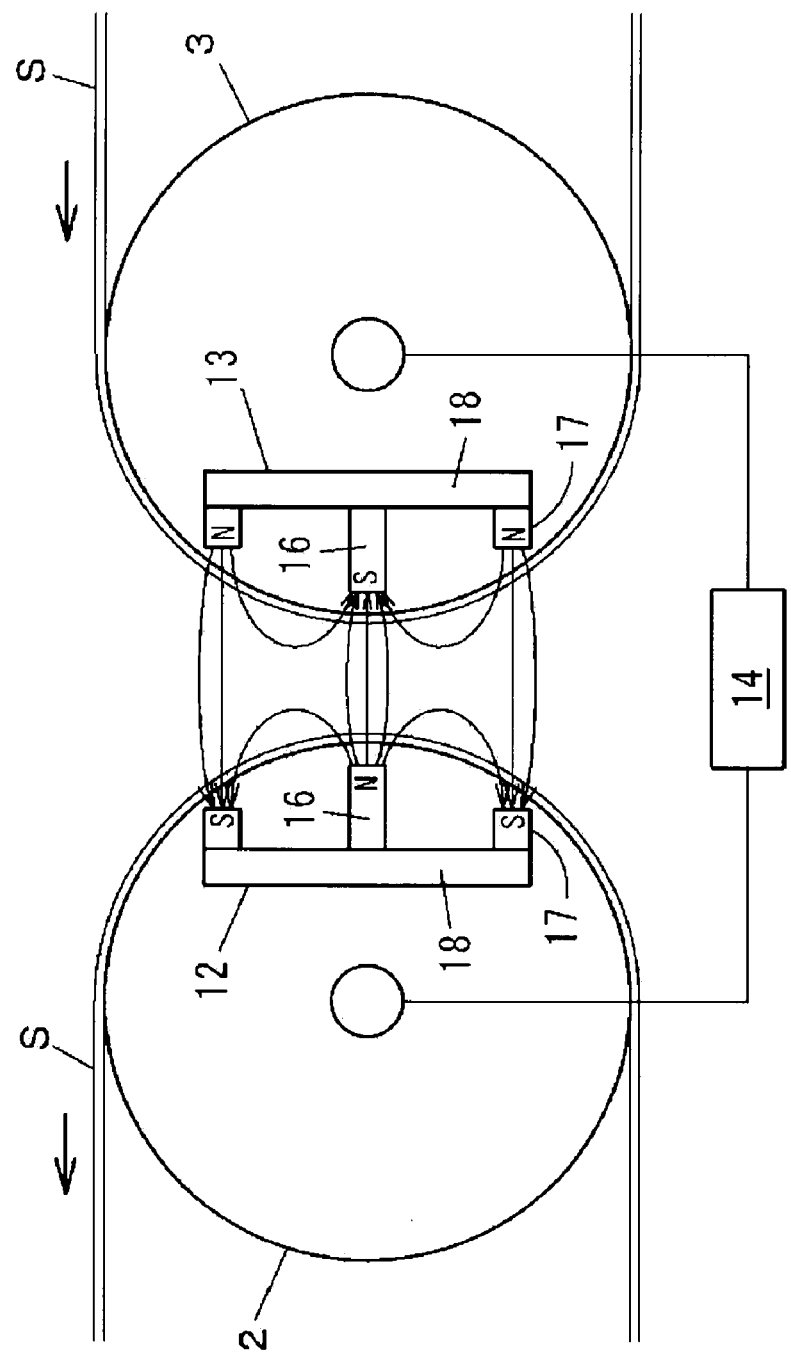
FIG. 7 is an enlarged sectional illustrative view of deposition rolls and magnetic field generating members, showing a comparative layout example in which the magnetic field generating members are disposed so as to form magnetic field lines extending between the deposition rolls.

In the above-mentioned embodiment, the race track-like magnetic field R for magnetron discharge having a double-apex sectional form and swollen from the roll surfaces toward the space between the rolls is generated in each of the deposition rolls 2 and 3 by disposing the magnetic poles in the magnetic field generating members 12 and 13 provided within the oppositely disposed deposition rolls 2 and 3 so that the magnetic poles of the same polarity are opposed to each other. However, the magnetic poles of the same polarity do not always have to be arranged oppositely. In FIG. 6, in which the magnetic field generating member 12 of one deposition roll 2 and the magnetic field generating member 13 of the other deposition roll are disposed so that the central magnet 16 and the circumferential magnet 17 having opposite polarities each other are opposed to each other, generation of magnetic field lines extending between the deposition rolls 2 and 3 can be prevented by disposing the magnetic field generating members 12 and 13 while mutually shifting the circumferential positions thereof, and the plasma can be converged to the vicinity of the roll surfaces facing the space 5 between the deposition rolls 2 and 3. In this case, when the magnetic field generating members 12 and 13 are oppositely disposed without positional shift, magnetic field lines extending between the deposition rolls 2 and 3 and directly connecting to the different electrode on the opposite side are formed as shown in FIG. 7, and the race track-like magnetic field for causing the magnetron discharge is weakened. Although discharge by the penning effect can be expected, when many magnetic field lines mutually connecting the rolls are present, by applying a voltage of the same polarity to the two deposition rolls, it is preferred to prevent formation of magnetic field lines such that they extend between the deposition rolls 2 and 3 as much as possible in the present invention in which glow discharge is caused by applying voltage to between the two deposition rolls 2 and 3.

Further, although the deposition rolls 2 and 3 are juxtaposed horizontally, and the gas supply means (film-forming gas supply pipe) and the evacuation means are disposed above and below the space between the deposition rolls, respectively, in the above-mentioned embodiment, the layout of the deposition rolls and the like is never limited to this. For example, the deposition rolls may be disposed vertically, with the gas supply means and the evacuation means being provided on one side and the other side of the space between the deposition rolls respectively. In short, it is only necessary to supply the gas from one side of the space between the deposition rolls and discharge from the other side. In the above-mentioned embodiment, of course, it is most preferred to dispose these means vertically as shown in FIG. 2.

The present invention described above can be summarized as follows.

Namely, the plasma CVD apparatus according to the present invention for forming a film on a surface of a substrate while continuously carrying the substrate within a vacuum chamber comprises: a pair of deposition rolls disposed oppositely in parallel or substantially in parallel to each other so that the substrate wound thereon faces each other; a magnetic field generating member provided inside each of the deposition rolls, which generates, in the vicinity of a roll surface thereof facing a space between the deposition rolls, a magnetic field swollen from the roll surface to a roll surface on the other side; a plasma power source with polarity alternately reversing between one electrode and the other electrode; gas supply means for supplying a film-forming gas to the space between the deposition rolls; and evacuation means for evacuating the space between the deposition rolls, wherein one electrode of the plasma power source is connected to one of the deposition rolls, and the other electrode is connected to the other of the deposition rolls.

According to this plasma CVD apparatus, since the magnetic field generating member which generates the swollen magnetic field particularly in the vicinity of the roll surfaces facing the space between the deposition rolls, and the plasma power source with alternately reversing polarity are provided, occurrence of electric discharge in the space between the pair of deposition rolls and convergence of plasma generated thereby to the vicinity of the respective deposition roll surfaces in the space between the deposition rolls can be attained without providing an enclosure for defining the space between the deposition rolls such as a discharge chamber or using a discharge electrode other than the deposition rolls. Therefore, only by supplying the film-forming gas from the gas supply means to the space between the deposition rolls, the film-forming gas is decomposed and activated by the plasma, and the decomposed gas is deposited on the surface of the substrate wound around the deposition rolls, facing the space between the deposition rolls, whereby a film can be efficiently formed. Since the enclosure or the discharge electrode other than the deposition rolls, to which the dissociated film-forming gas is adsorbed, is absent, film formation to the substrate can be performed without film deposition to such a part, and a high-quality film can be formed while suppressing the film defects and deterioration of film forming stability resulting from the film deposition.

The magnetic field generating member provided in each of the deposition rolls preferably includes a magnetic pole disposed so that each of the magnetic field generating member forms a substantially closed magnetic circuit without magnetic field lines extending between the magnetic field generating member provided in one of the deposition rolls and the magnetic field generating member provided in the other of the deposition rolls. By providing such magnetic field generating members, formation of a magnetic field with swollen magnetic field lines can be promoted in the vicinity of the surface of each deposition roll facing the space between the deposition rolls, and since the plasma is easily converged to the swollen part, the film forming efficiency can be improved.

In this case, preferably, the magnetic field generating member provided in each of the deposition rolls has a race track-like magnetic pole long in the roll axial direction, and the magnetic pole in each of the magnetic field generating member is disposed so that the magnetic pole of one of the magnetic field generating member and the magnetic pole of the other of the magnetic field generating member opposed to the magnetic pole of one of the magnetic field generating member have the same polarity. By providing such magnetic field generating members, the race track-like magnetic field can be easily formed for each magnetic field generating member, in the vicinity of the roll surface facing the space between the deposition rolls along the longitudinal direction of the roll axis without magnetic field lines extending to the magnetic field generating member on the opposed roll side, and plasma can be converged to the magnetic field. Therefore, a film can be efficiently formed using a broad substrate wound along the roll width direction.

The gas supply means is preferably provided on one side of the space between the deposition rolls, and the evacuation means is preferably provided on the other side of the space between the deposition rolls. Such layout of the gas supply means and the evacuation means allows efficient supply of the film-forming gas to the space between the deposition rolls to improve the film forming efficiency.

The pressure of the space between the deposition rolls is preferably set to 0.1 to 10 Pa. According to this, glow discharge can be efficiently caused around the area close to the surface of the deposition rolls where the magnetic fields are present, and excellent film forming property can be obtained.

[Industrial Usability]

As described above, the film forming apparatus according to the present invention is useful as a film forming apparatus for continuously forming a functional film on a surface of a strip-like substrate such as plastic film or sheet, and can suitably form a high-quality film on the substrate while suppressing film deposition to the inside of a vacuum chamber.

The invention claimed is:

1. A plasma chemical vapor deposition (CVD) apparatus for forming a film on a surface of a substrate while continuously carrying the substrate within a vacuum chamber, comprising:

a pair of deposition rolls disposed oppositely in parallel or substantially in parallel to each other so that the substrate wound thereon faces each other;

a magnetic field generating member provided inside each of said deposition rolls, which generates, in the vicinity of a roll surface thereof facing a space between said deposition rolls, a magnetic field swollen from said roll surface to a roll surface on the other side of the space;

a plasma power source with polarity alternately reversing between one electrode and another electrode;

a gas supplier for supplying a film-forming gas to said space between said deposition rolls; and an evacuator for evacuating said space between said deposition rolls, wherein the one electrode of said plasma power source is connected to one of the rolls of said pair of deposition rolls, and the another electrode is connected to the other of the rolls of said pair of deposition rolls.

2. The plasma CVD apparatus according to claim 1, wherein said magnetic field generating member provided in each of said deposition rolls includes a magnetic pole disposed so that each of said magnetic field generating member forms a substantially closed magnetic circuit without magnetic field lines extending between said magnetic field generating member provided in one of said deposition rolls and said magnetic field generating member provided in the other of said deposition rolls.

3. The plasma CVD apparatus according to claim 2, wherein said magnetic field generating member provided in each of said deposition rolls has a race track-like magnetic pole long in the roll axial direction, and said magnetic pole in each of said magnetic field generating member is disposed so that said magnetic pole of one of said magnetic field generating member and said magnetic pole of the other of said magnetic field generating member opposed to said magnetic pole of one of said magnetic field generating member have the same polarity.

4. The plasma CVD apparatus according to claim 1, wherein said gas supply means is provided on one side of said space between said deposition rolls, and said evacuation means is provided on the other side of said space between said deposition rolls.

5. The plasma CVD apparatus according to claim 1, wherein the pressure of said space between said deposition rolls is set to 0.1 to 10 Pa.

6. The plasma CVD apparatus according to claim 1, wherein said evacuator comprises an evacuation port connected to a vacuum pump.

7. The plasma CVD apparatus according to claim 1, wherein said gas supplier supplies a raw material gas for forming a Si-containing film, a C-containing film, or a Ti-containing film.

8. The plasma CVD apparatus according to claim 1, wherein said magnetic field generating member provided inside each of said deposition rolls includes a central magnet long in the roll axial direction, a circumferential magnet surrounding the circumference of the central magnet, and a magnetic field short-circuit member connecting the magnets inside the roll.

9. The plasma CVD apparatus according to claim 1, wherein said substrate is an insulating material.

10. The plasma CVD apparatus according to claim 1, wherein said substrate is a conductive material.

* * * * *